(12) United States Patent
Sim et al.

(10) Patent No.: US 12,463,589 B2
(45) Date of Patent: Nov. 4, 2025

(54) OSCILLATOR CIRCUIT DEVICE

(71) Applicant: POSTECH RESEARCH AND BUSINESS DEVELOPMENT FOUNDATION, Pohang-si (KR)

(72) Inventors: Jae Yoon Sim, Pohang-si (KR); Young Woo Ji, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 0 days.

(21) Appl. No.: 18/582,307

(22) Filed: Feb. 20, 2024

(65) Prior Publication Data

US 2024/0283403 A1   Aug. 22, 2024

(30) Foreign Application Priority Data

Feb. 21, 2023   (KR) ................. 10-2023-0023219

(51) Int. Cl.
  *H03B 5/04*   (2006.01)
  *H03K 3/011*   (2006.01)
  *H03K 3/0231*   (2006.01)

(52) U.S. Cl.
  CPC ............. *H03B 5/04* (2013.01); *H03K 3/011* (2013.01); *H03K 3/0231* (2013.01)

(58) Field of Classification Search
  CPC .................................................. H03B 5/04
  USPC ......................................................... 331/111
  See application file for complete search history.

(56) References Cited

U.S. PATENT DOCUMENTS

| | | | | |
|---|---|---|---|---|
| 11,929,745 | B1* | 3/2024 | Huang | H03K 3/0231 |
| 2007/0285185 | A1* | 12/2007 | Kwon | H03L 7/085 |
| | | | | 331/135 |
| 2009/0072918 | A1* | 3/2009 | Chung | H03K 4/501 |
| | | | | 331/113 R |

OTHER PUBLICATIONS

Jiang et al., "A 0. 14mm2 16MHz CMOS RC Frequency Reference with a 1-Point Trimmed Inaccuracy of from -31°to 85°," ISSCC, pp. 436-437, Feb. 2021.

(Continued)

*Primary Examiner* — Joseph Chang
(74) *Attorney, Agent, or Firm* — Morgan, Lewis & Bockius LLP

(57) ABSTRACT

Disclosed an oscillator circuit device includes: a resistor circuit comprising a first resistor disposed between a first supply voltage level and an output node; a resistor-capacitor circuit comprising a second resistor and at least one capacitor disposed between the output node and a second supply voltage level and connected in series, and a switch capable of discharging electric charges accumulated in the at least one capacitor; and a comparator configured to compare a voltage level to be compared obtained from the resistor circuit with a predetermined reference to allow the switch to be opened and closed according to a comparison result.

16 Claims, 14 Drawing Sheets

(56) References Cited

OTHER PUBLICATIONS

W. Choi et al., "A 0.9V 28MHz Dual-RC Frequency Reference with 5pJ/Cycle and ±200ppm Inaccuracy from −40° to 85°," ISSCC, pp. 434-435, Feb. 2021.
C. Gurleyuk et al., "A 16MHz CMOS RC Frequency Reference with ±400ppm Inaccuracy from −45° to 85° After Digital Linear Temperature Compensation," ISSCC, pp. 64-65, Feb. 2020.
A. Khashaba et al., "A 34μW 32MHz RC Oscillator with ±530ppm Inaccuracy from −40° to 85° and 80ppm/V Supply Sensitivity Enabled by Pulse-Density Modulated Resistors," ISSCC, pp. 66-67, Feb. 2020.
G. Cristiano et al., "An 8.7ppm/°694nW, One-Point Calibrated RC Oscillator Using a Nonlinearity-Aware Dual Phase-Locked Loop and DSM-Controlled Frequency-Locked Loops," IEEE Symp. VLSI Circuits, pp. 1-2, Jun. 2020.

\* cited by examiner

OSCILLATOR CIRCUIT DEVICE

CROSS-REFERENCE TO RELATED APPLICATION

The present application claims a convention priority under 35 U.S.C. § 119(a) based on Korean Patent Application No. 10-2023-0023219 filed on Feb. 21, 2023, the entire content of which is incorporated herein in its entirety by reference.

STATEMENT REGARDING FOREIGN RIGHTS

This invention was made from the research supported by National R&D Program through the National Research Foundation of Korea (NRF) funded by Ministry of Science and ICT [NRF-2020M3F3A2A02082435].

BACKGROUND

1. Technical Field

The present disclosure relates to a signal generator and, more particularly, to an oscillator circuit configured based on a combination of a resistor and a capacitor.

2. Related Arts

Many electronic devices require a clock signal with a well-defined and precise frequency. A crystal oscillator is one of most typical oscillators having been used to generate the clock signal. However, despite of a trend of implementing all circuit components on a semiconductor chip as much as possible to miniaturize an application device and reduce the power consumption, it is difficult to mount the crystal oscillator on a monolithic semiconductor chip. Accordingly, there is a need for an on-chip oscillator circuit that can be implemented on the semiconductor chip. An RC oscillator is one of promising candidates for the on-chip oscillator circuits.

FIG. 1 shows an example of a conventional RC oscillator. The RC oscillator may include an RC circuit 10 comprised of a resistor R and a capacitor C connected in series between a supply voltage VDD and ground, and a relaxation loop 20 periodically resetting a voltage across the capacitor C. The relaxation loop 20 includes a comparator 22 comparing a voltage of a node 12 between the resistor R and the capacitor C with a reference voltage $V_{REF}$ and a switch 24 disposed between the node 12 and the ground and being opened and closed according to an output of the comparator 22.

A voltage $V_{RC}$ across the capacitor C, i.e., the voltage at the node 12, which has an initial value of zero, may be expressed by Equation 1 at a certain time. As can be seen in the Equation 1, the voltage $V_{RC}$ at the node 12 increases according to a RC time constant.

$$V_{RC}(t) = V_{DD}\left(1 - e^{-\frac{t}{RC}}\right) \quad \text{[Equation 1]}$$

When the voltage $V_{RC}$ at the node 12 reaches the reference voltage $V_{REF}$, the switch 24 is closed in response to the output of the comparator 22. Accordingly, the charge accumulated in the capacitor C is discharged through the switch 24, and the voltage $V_{RC}$ at the node 12 is reset to an initial value. As this process is repeated, the voltage $V_{RC}$ at the node 12 oscillates and shows a waveform illustrated in FIG. 2.

The period T of the oscillation signal having the waveform of FIG. 2 depends on a RC time constant. Therefore, the RC time constant needs to be invariant to the supply voltage and a temperature change. However, the resistance R of the resistor reveals a temperature dependency as shown in FIG. 3A. For example, the resistance at an extremely low temperature $T_L$ and an extremely high temperature $T_H$ are generally greater than the resistance at a moderate temperature $T_M$. Accordingly, when the RC oscillator is used in a wide temperature range of −40° C. to 125° C., for example, the RC time constant may exhibit a difference of 50 ppm/° C. or larger as depicted in FIG. 3B. An increase in the resistance at the extremely low temperature $T_L$ or the extremely high temperature $T_H$ increases the RC time constant and results in a decrease in the oscillation frequency.

When the temperature dependency of the resistance is modeled by a polynomial, a first-order temperature coefficient, i.e., the temperature dependency expressed by a first-order term in the polynomial, can be cancelled or reduced by using a series combination of a proportional-to-absolute temperature (PTAT) resistor of which resistance increases with temperature and a complimentary-to-absolute temperature (CTAT) resistor of which resistance decreases with temperature. A second-order temperature coefficient, however, cannot be cancelled by the PTAT and CTAT resistors and reduces an accuracy of an output frequency even after the first-order temperature coefficient is cancelled.

Recently, several researches for delta-sigma-modulator (DSM)-based RC oscillators successfully demonstrated a single-digit temperature coefficient by employing a polynomial correction or switched resistors. See Jiang et al., "A 0.14 mm2 16 MHz CMOS RC Frequency Reference with a 1-Point Trimmed Inaccuracy of from −45° to 85° ISSCC, pp. 436-437, February 2021; W. Choi et al., "A 0.9V 28 MHz Dual-RC Frequency Reference with 5 pJ/Cycle and +200 ppm Inaccuracy from −40° to 85°," ISSCC, pp. 434-435, February 2021; and C. Gurleyuk et al., "A 16 MHZ CMOS RC Frequency Reference with +400 ppm Inaccuracy from −45° to 85° After Digital Linear Temperature Compensation," ISSCC, pp. 64-65, February 2020 for the former approach, and A. Khashaba et al., "A 34 µW 32 MHz RC Oscillator with ±530 ppm Inaccuracy from −40° to 85° and 80 ppm/V Supply Sensitivity Enabled by Pulse-Density Modulated Resistors," ISSCC, pp. 66-67, February 2020; and G. Cristiano et al., "An 8.7 ppm/° 694 nW, One-Point Calibrated RC Oscillator Using a Nonlinearity-Aware Dual Phase-Locked Loop and DSM-Controlled Frequency-Locked Loops," IEEE Symp. VLSI Circuits, pp. 1-2, June 2020 for the latter approach. However, these approaches may require a trimming at more than two points, a large energy per operation, or a large area to operate non-linearity correction circuits.

Meanwhile, the RC oscillator of FIG. 1 has another problem related to a size of the switch 24 resetting the capacitor. When the aspect ratio (W/L) of the switch 24 is small, it takes a long time for the switch 24 to reset the RC circuit 10. When the aspect ratio of the switch 24 is large, a large amount of leakage current flows at high temperatures, which affects the frequency of the oscillation signal. In other words, there exists a trade-off relationship between a reset speed and the leakage current in a reset transistor used for the switch 24, such that a transistor with a high threshold voltage may cause a small leakage current but may result in a low reset speed while a transistor with a low threshold voltage may improve the reset speed but may result in a large leakage current and deteriorate a stability of the oscillation period. On the other hand, a comparator delay, i.e., a time required for a comparison operation in the comparator 22, may also affect the oscillation period. A large comparator delay may increase the period of the oscillation signal and make a non-linear temperature dependency not negligible compared with the RC time constant, while a small comparator delay may require a large power consumption in the comparator 22. As a result, a comparison time $\tau_{COMP}$ in the comparator 22 and a reset time $\tau_{RESET}$ of the switch 24 in addition to the RC time constant $\tau_{RC}$ affect the period or the frequency of the oscillation signal as shown in FIG. 3C in the conventional RC oscillator.

SUMMARY

Provided is an oscillator circuit device capable of generating an oscillation signal with an accurate and constant frequency regardless of an ambient temperature.

Provided is an oscillator circuit device capable of generating an oscillation signal with an accurate and constant frequency while minimizing an influence of a leakage current with low power even at a low or a high temperature.

According to an aspect of an exemplary embodiment, an oscillator circuit device includes: a resistor circuit comprising a first resistor disposed between a first supply voltage level and an output node; a resistor-capacitor circuit comprising a second resistor and at least one capacitor disposed between the output node and a second supply voltage level and connected in series, and a switch capable of discharging electric charges accumulated in the at least one capacitor; and a comparator configured to compare a voltage level to be compared obtained from the resistor circuit with a predetermined reference to allow the switch to be opened and closed according to a comparison result.

The at least on capacitor may include a switched capacitor circuit disposed between the second resistor and the second supply voltage level and comprising two capacitors connected in parallel to each other to be alternately charged and discharged.

The resistor circuit may include a single resistor. In such an embodiment, the output node may be a node between the resistor circuit and the resistor-capacitor circuit.

The voltage level to be compared may be a voltage level of the output node.

The resistor circuit may include the first resistor and a third resistor disposed between the first resistor and the output node and connected in series to the first resistor.

The voltage level to be compared may be a voltage level of an auxiliary output node between the first resistor and the third resistor.

The switched capacitor circuit may include: a first capacitor having a first terminal connected to the second resistor; a first transistor having a drain connected to a second terminal of the first capacitor, a source connected to ground, and a gate suitable for receiving a first transition clock signal; a second transistor having a drain connected to the first terminal of the first capacitor, a source connected to the second terminal of the first capacitor, and a gate suitable for receiving a second transition clock signal; a second capacitor having a first terminal connected to the second resistor; a third transistor having a drain connected to a second terminal of the second capacitor, a source connected to ground, and a gate suitable for receiving the second transition clock signal; and a fourth transistor having a drain connected to the first terminal of the second capacitor, a source connected to a fourth terminal of the second capacitor, and a gate suitable for receiving the first switching signal.

The oscillator circuit device may further include a clock generation circuit configured to generate the first transition clock signal and the second transition clock signal according to an output signal of the comparator.

The clock generation circuit may include a signal delay line configured to delay the output signal of the comparator.

The oscillator circuit device may further include a feedback loop circuit configured to adjust a delay introduced to the output signal of the comparator by the clock generation circuit.

The comparator may include a first comparator configured to compare the auxiliary output voltage with the predetermined reference. The feedback loop circuit may include: a second comparator configured to compare the output voltage with the reference value; a charge pump configured to adjust a control voltage according to an output of the second comparator; and a loop filter configured to filter the control voltage to provide a filtered control voltage to the clock generation circuit, so that the clock generation circuit adjust the delay introduced to the output signal of the comparator according to the filtered control voltage.

The feedback loop circuit may further include a sampler configured to sample the output voltage to provide a sampled output voltage to the second comparator.

According to an aspect of another exemplary embodiment, an oscillator circuit device includes: a first resistor disposed between a first supply voltage level and a first auxiliary output node; a second resistor and a first switched capacitor circuit connected in series and disposed between a first output node and a second supply voltage level; a third resistor disposed between the first auxiliary output node and the first output node; a fourth resistor disposed between a second auxiliary output node and a fourth supply voltage level; a fifth resistor and a second switched capacitor circuit connected in series and disposed between a third supply voltage level and a second output node; a sixth resistor disposed between the second output node and the second auxiliary output node; a first comparator configured to compare a first auxiliary output voltage level at the first auxiliary output node with a second auxiliary output voltage level of at second auxiliary output node; and a signal delay and clock generation circuit configured to generate transition clock signals for controlling charging and discharging operations of the first switched capacitor circuit and the second switched capacitor circuit according to an output of the first comparator.

The signal delay and clock generation circuit may include a signal delay line configured to add an additional delay to the output of the first comparator.

The oscillator circuit device may further include a feedback loop circuit configured to adjust the additional delay added to the output of the first comparator by the signal delay and clock generation circuit.

The feedback loop circuit may include: a second comparator configured to compare a first output voltage of the first output node with a second output voltage of the second output node; a charge pump configured to adjust a control voltage according to an output of the second comparator; and a loop filter configured to filter the control voltage to provide a filtered control voltage to the signal delay and clock generation circuit, so that the signal delay and clock generation circuit adjust the additional delay added to the output of the first comparator according to the filtered control voltage.

The feedback loop circuit may further include a sampler configured to sample the first output voltage level and the second output voltage level to provide sampled output voltage levels to the second comparator.

According to an exemplary embodiment of the present disclosure, an R-RC circuit may be constructed by adding one resistor to a capacitor side in an R-C circuit, and resistances of the resistors may be set such that second-order temperature dependencies between the resistors are cancelled. Accordingly, not only the first-order temperature dependencies but also the second-order temperature dependencies of the resistances are removed or significantly reduced, and the oscillator circuit may generate an oscillation signal with an accurate and constant frequency regardless of the temperature dependencies of the resistances.

The problem related to a size of the reset switch resetting the capacitor may be solved by implementing the capacitor and the reset switch by a switched capacitor circuit including two identical capacitors.

A comparator delay may be removed or significantly reduced by adding another resistor in the R-RC circuit and to generate an auxiliary output signal and comparing the auxiliary output signal instead of an output signal. Further, the frequency stability of the output signal may be improved by variably adjusting the comparator delay by a delay-based feedback structure. Accordingly, the oscillator circuit may generate an oscillation signal having an accurate and constant frequency using a low-power comparator while minimizing an influence of leakage current even at an extremely low or an extremely high temperature.

Therefore, the oscillator circuit may generate a clock signal with low power in a wide temperature range while minimizing influences of external factors such as a semiconductor manufacturing process, voltage, and temperature.

The oscillator circuit device of the present disclosure is applicable to various analog and digital integrated circuits or electronic systems and can replace existing RC circuit oscillators.

BRIEF DESCRIPTION OF THE DRAWINGS

In order that the disclosure may be well understood, there will now be described various forms thereof, given by way of example, reference being made to the accompanying drawings, in which.

Figure 1:
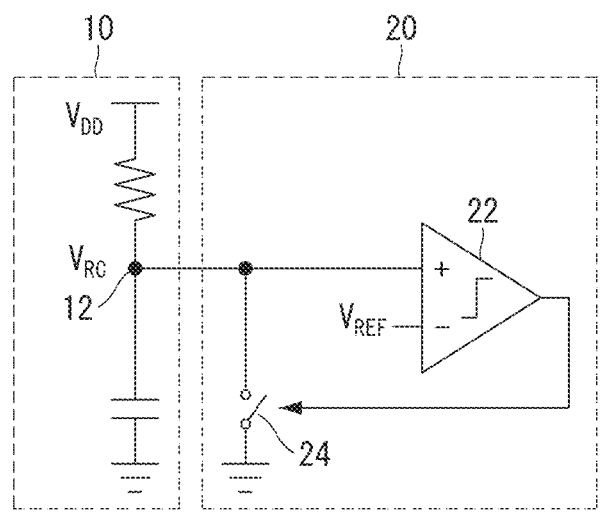
FIG. 1 is a block diagram of a conventional RC oscillator circuit.
Figure 2:
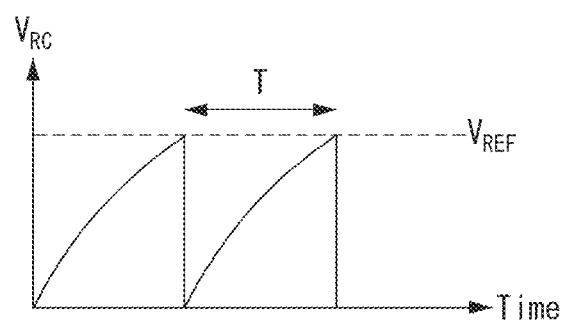
FIG. 2 is a waveform diagram illustrating an ideal output signal of the RC oscillator circuit of FIG. 1.
Figure 3A:
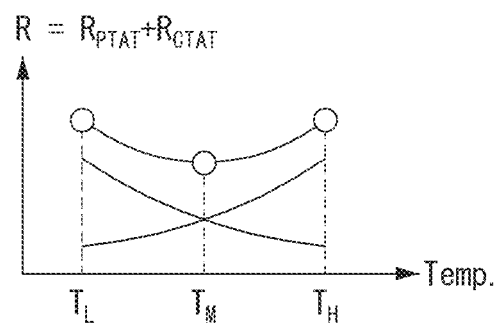
FIG. 3A is a graph for explaining a temperature dependency of a resistance in the RC oscillator circuit of FIG. 1.
Figure 3B:
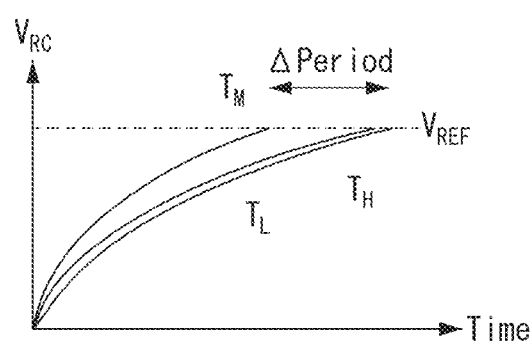
FIG. 3B is a graph for explaining a variation of a RC time constant due to the temperature dependency of the resistance.
Figure 3C:
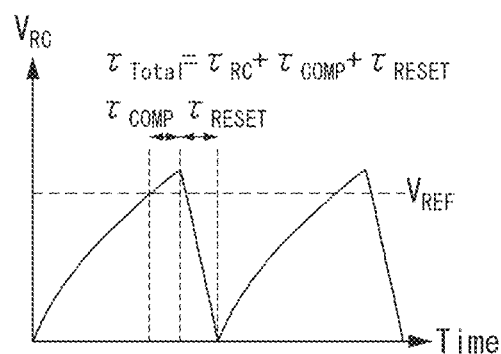
FIG. 3C is a waveform diagram for explaining other factors affecting a period of an oscillation signal in the conventional RC oscillator circuit.

The drawings described herein are for illustration purposes only and are not intended to limit the scope of the present disclosure in any way.

DETAILED DESCRIPTION

For a clearer understanding of the features and advantages of the present disclosure, exemplary embodiments of the present disclosure will be described in detail with reference to the accompanied drawings. However, it should be understood that the present disclosure is not limited to particular embodiments disclosed herein but includes all modifications, equivalents, and alternatives falling within the spirit and scope of the present disclosure. In the drawings, similar or corresponding components may be designated by the same or similar reference numerals.

The terminologies including ordinals such as "first" and "second" designated for explaining various components in this specification are used to discriminate a component from the other ones but are not intended to be limiting to a specific component. For example, a second component may be referred to as a first component and, similarly, a first component may also be referred to as a second component without departing from the scope of the present disclosure. As used herein, the term "and/or" may include a presence of one or more of the associated listed items and any and all combinations of the listed items.

In the description of exemplary embodiments of the present disclosure, "at least one of A and B" may mean "at least one of A or B" or "at least one of combinations of one or more of A and B". In addition, in the description of exemplary embodiments of the present disclosure, "one or more of A and B" may mean "one or more of A or B" or "one or more of combinations of one or more of A and B".

When a component is referred to as being "connected" or "coupled" to another component, the component may be directly connected or coupled logically or physically to the other component or indirectly through an object therebetween. Contrarily, when a component is referred to as being "directly connected" or "directly coupled" to another component, it is to be understood that there is no intervening object between the components. Other words used to describe the relationship between elements should be interpreted in a similar fashion.

The terminologies are used herein for the purpose of describing particular exemplary embodiments only and are not intended to limit the present disclosure. The singular forms include plural referents as well unless the context clearly dictates otherwise. Also, the expressions "comprises," "includes," "constructed," "configured" are used to refer a presence of a combination of stated features, numbers, processing steps, operations, elements, or components, but are not intended to preclude a presence or addition of another feature, number, processing step, operation, element, or component.

Unless defined otherwise, all terms used herein, including technical or scientific terms, have the same meaning as commonly understood by those of ordinary skill in the art to which the present disclosure pertains. Terms such as those defined in a commonly used dictionary should be interpreted as having meanings consistent with their meanings in the context of related literatures and will not be interpreted as having ideal or excessively formal meanings unless explicitly defined in the present application.

Exemplary embodiments of the present disclosure will now be described in detail with reference to the accompanying drawings. In order to facilitate general understanding in describing the present disclosure, the same components in the drawings are denoted with the same reference signs, and repeated description thereof will be omitted.

Figure 4:
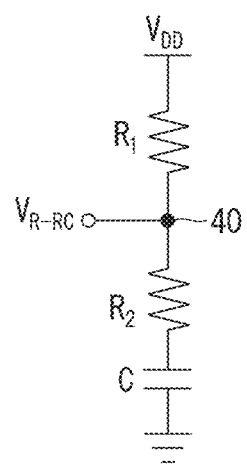
FIG. 4 is a circuit diagram of an R-RC circuit according to an exemplary embodiment of the present disclosure.

FIG. 4 is a circuit diagram of an R-RC circuit according to an exemplary embodiment of the present disclosure.

The R-RC circuit includes a first resistor R1, a second resistor R2, and a capacitor C. The first resistor R1 is disposed between a supply voltage VDD and an output node 40, and a RC circuit comprised of the second resistor R2 and the capacitor C connected in series is disposed between the output node 40 and ground. Compared with the RC circuit of FIG. 1, the circuit of FIG. 4 further includes the second resistor R2 added between the output node 40 and the capacitor C.

Figure 5A:
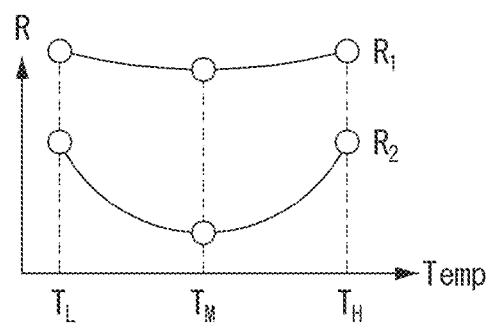
FIG. 5A is a graph illustrating a difference in a temperature dependency of resistance between resistors in the R-RC circuit of FIG. 4.

As shown in FIG. 5A, the first resistor R1 and the second resistor R2 may have exhibit different temperature dependences from each other. However, the present disclosure is not limited thereto, and the first resistor R1 and the second resistor R2 may have the same temperature dependences with each other. In an exemplary embodiment, the first resistor R1 may be implemented by a proportional-to-absolute temperature (PTAT) resistor $R_{PTAT}$ of which resistance increases with temperature, and the second resistor R2 may be implemented by a complementary-to-absolute temperature (CTAT) resistor $R_{CTAT}$ of which resistance decreases with temperature. In another exemplary embodiment, the first resistor R1 may be implemented by the CTAT resistor $R_{CTAT}$, and the second resistor R2 may be implemented by the PTAT resistor $R_{PTAT}$. Alternatively, both the first resistor R1 and the second resistor R2 may be implemented by a combination of the CTAT resistor $R_{CTAT}$ and the PTAT resistor $R_{PTAT}$. In another alternative embodiment, only one of the first resistor R1 and the second resistor R2 may be implemented by the combination of the CTAT resistor $R_{CTAT}$ and the PTAT resistor $R_{PTAT}$ while the other one of the first resistor R1 and the second resistor R2 may be implemented by either the CTAT resistor $R_{CTAT}$ or the PTAT resistor $R_{PTAT}$.

In the R-RC circuit of FIG. 4, an output voltage $V_{R-RC}$ at the output node 40 at a certain time (t) is expressed by Equation 2.

$$V_{R-RC}(t) = V_{DD}\left(1 - \frac{R_1}{R_1+R_2}e^{-\frac{t}{(R_1+R_2)C}}\right) \quad \text{[Equation 2]}$$

An initial value of the output voltage $V_{R-RC}$ at the output node 40 is expressed by Equation 3, and, in particular, can be expressed by Equation 4 when the first resistance R1 is sufficiently greater than the second resistance R2.

$$V_{R-RC}(0) = V_{DD}\left(\frac{R_2}{R_1+R_2}\right) \quad \text{[Equation 3]}$$

$$V_{R-RC}(0) \cong V_{DD}\left(\frac{R_2}{R_1}\right) \quad \text{[Equation 4]}$$

Figure 5B:
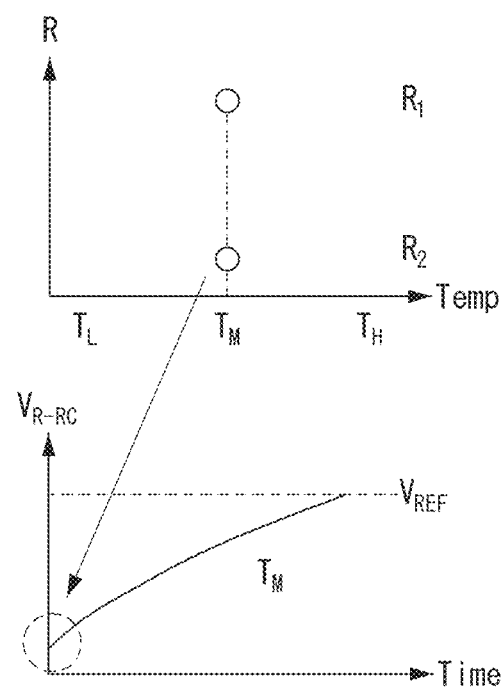
FIG. 5B is a graph for explaining a change in an output voltage of the R-RC circuit due to an additional resistance in the R-RC circuit of FIG. 4.
Figure 5C:
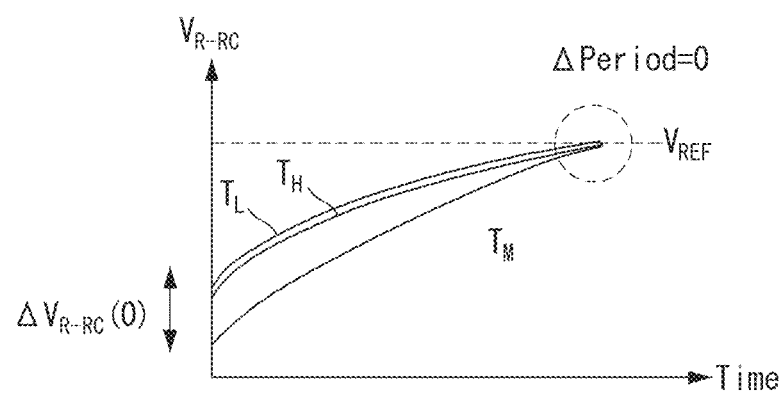
FIG. 5C is a graph illustrating a temperature independency of a rise time of the output voltage of the R-RC circuit of FIG. 4.

As can be seen in Equation 4, the initial value of the output voltage $V_{R-RC}$ at the output node 40 is not zero. That is, unlike the RC circuit of FIG. 1 in which the initial value of the output voltage at the output node 12 is zero, the output voltage of the output node 40 in the R-RC circuit of FIG. 4 has a non-zero initial value (as shown in FIG. 5B). The initial value of the output voltage $V_{R-RC}$ at the output node 40 can be set to any desired value through a selection of the first resistor R1 and the second resistor R2. In particular, the initial value of the output voltage $V_{R-RC}$ at the moderate temperature $T_M$ may be set to a value different from the initial values at the low temperature $T_L$ and/or the high temperature $T_H$ (as shown in FIG. 5C).

Although the resistance at the moderate temperature $T_M$ is different from the resistances at the low temperature $T_L$ and/or the high temperature $T_H$ due to the temperature dependency of the resistance, and accordingly the time constant may change according to the temperature, an exemplary embodiment of the present disclosure enables to keep a rise time and the frequency of the output voltage $V_{R-RC}$ to be constant by utilizing the difference in the initial value of the output voltage $V_{R-RC}$ in the moderate temperature $T_M$ and the initial values in the low temperature $T_L$ and/or the high temperature $T_H$. These characteristics will be described in more detail with reference to FIG. 5B. It is assumed that the resistance of the first resistor R1 and the second resistor R2 are greater at the low temperature $T_L$ and/or the high temperature $T_H$ than at the moderate temperature $T_M$ as shown in FIG. 5A. Further, it is assumed, for simplicity, that resistances at the low temperature $T_L$ and the high temperature $T_H$ are similar to each other.

Due to the difference in the temperature dependency of the first resistance R1 and the second resistance R2, the time constant at the moderate temperature $T_M$ is smaller than the time constants at the low temperature $T_L$ and/or the high temperature $T_H$, and the output voltage $V_{R-RC}$ increases at a faster rate at the moderate temperature $T_M$ than at the low temperature $T_L$ and/or the high temperature $T_H$. According to an exemplary embodiment of the present disclosure, the initial values of the output voltage $V_{R-RC}$ at the low temperature $T_L$ and/or the high temperature $T_H$ are set to a larger value than the initial value at the moderate temperature $T_M$ as shown in FIG. 5C, so that a rise time from a reset timing (e.g., t=0) to a certain reference level $V_{REF}$ may be the same for the moderate temperature $T_M$, the low temperature $T_L$, and the high temperature $T_H$. Since the rise time from the reset timing (t=0) to the reference level $V_{REF}$ is independent from the temperature, the frequency associated with the periodic oscillation of the output voltage $V_{R-RC}$ may also be kept constant regardless of the temperature if there is no difference in the other factors. The resistances of the first resistor R1 and the second resistor R2 may be set such that the difference in the secondary temperature dependency between the resistances may be cancelled.

Figure 6:
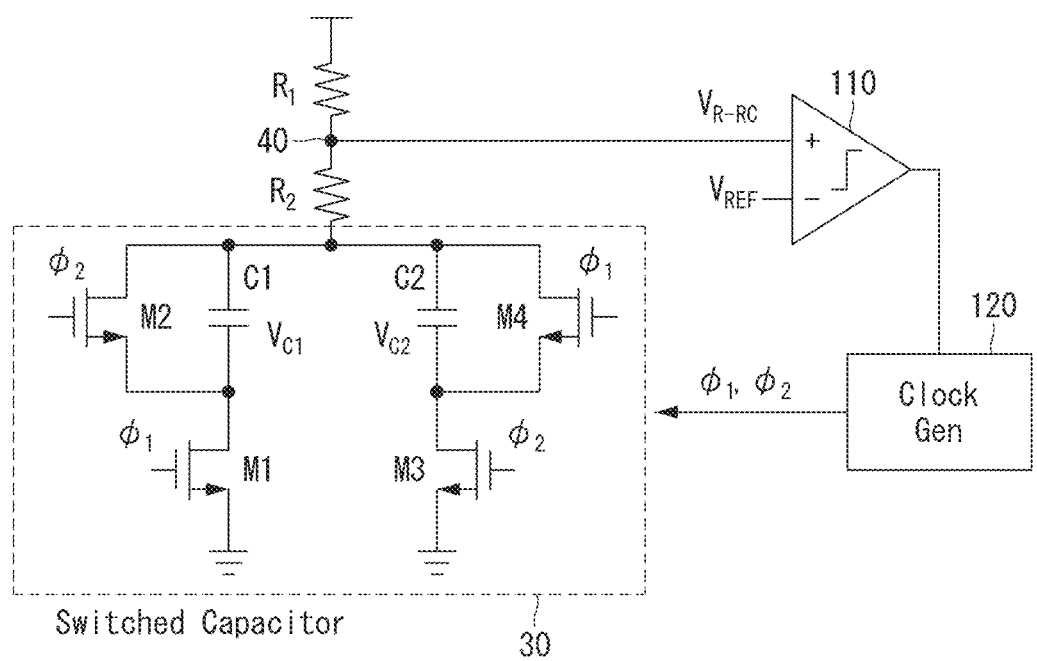
FIG. 6 is a block diagram of an oscillator circuit according to an exemplary embodiment of the present disclosure.

FIG. 6 is a block diagram of an oscillator circuit according to an exemplary embodiment of the present disclosure. The oscillator circuit according to the present embodiment includes an R-RC circuit including a first resistor R1, a second resistor R2, and a switched capacitor circuit 30. The oscillator circuit further include a comparator 110 and a clock generator 120.

The switched capacitor circuit 30 includes two capacitors C1 and C2 and four transistor switches M1-M4. The capacitors C1 and C2 alternately charges and discharges according to on/off states of the transistor switches M1-M4. That is, while one capacitor is being charged, the other capacitor is discharged and reset through a parallel switch. In this way, the discharging and reset for one capacitor is done during a RC transition time of the other capacitor, and the reset time does not affect an output frequency. Therefore, the four transistors can be very small with ultra-low leakage. Also, as the capacitor voltage is in a full reset state when it changes the operation phase, the output voltage can have a sharp transition to an initial point of the R-RC transition.

In the switched capacitor circuit 30, a first terminal of a first capacitor C1 is coupled to the second resistor R2, and a second terminal of the first capacitor C1 is coupled to a drain of a first transistor M1. A source of the first transistor M1 is grounded, and a gate of the first transistor M1 is provided with a first transition clock signal Φ1. A drain and a source of a second transistor M2 are coupled to the first and the second terminals of the first capacitor C1, respectively, and the gate of the second transistor M2 is provided with a second transition clock signal Φ2 having a level complementary to that of the first transition clock signal Φ1. A first terminal of the second capacitor C2 is coupled to the second resistor R2, and a second terminal of the second capacitor C2 is coupled to a drain of a third transistor M3. A source of the third transistor M3 is grounded, and a gate of the third transistor M3 is provided with the second transition clock signal Φ2. A drain and a source of a fourth transistor M4 are coupled to the first and the second terminals of the second capacitor C2, respectively, and the gate of the fourth transistor M4 is provided with the first transition clock signal Φ1.

The connections of the first resistor R1 and the second resistor R2 to the supply voltage, the ground, and the capacitor circuit 30 and the operation of the resistors R1 and R2 may be similar to those for the circuit shown in FIG. 4. The comparator 110 compares the output voltage $V_{R-RC}$ of the R-RC circuit with the reference level $V_{REF}$, and the clock generator 120 generates the first transition clock signal Φ1 and the second transition clock signal Φ2 according to an output of the comparator 110 to provide to the switched capacitor circuit 30.

The oscillator circuit of FIG. 6 operates as follows.

Figure 7:
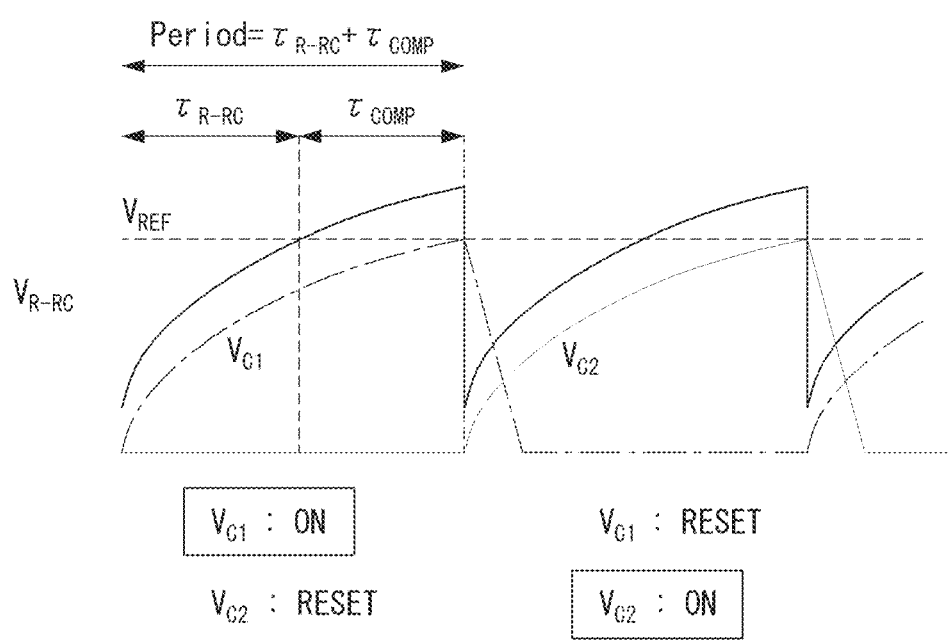
FIG. 7 is a waveform diagram showing voltages across two capacitors and an output voltage in the oscillator circuit of FIG. 6.

It is assumed that, immediately after the supply voltage is initially applied, the first transition clock signal Φ1 has a high level and the second transition clock signal Φ2 has a low level. Under such a condition, the first transistor M1 is turned on to connect the second terminal of the first capacitor C1 to ground. The second transistor M2 is turned off. At this time, the first capacitor C1 may operate like a typical single capacitor. Meanwhile, the third transistor M3 is turned off. The fourth transistor M4 is turned on to form a detour path for the second capacitor C2 and discharge the second capacitor C2. Accordingly, the current supplied through the first resistor R1 and the second resistor R2 charges the first capacitor C1, and the voltage $V_{C1}$ across the first capacitor C1 rises. At this time, as shown in FIG. 7, the output voltage $V_{R-RC}$ of the R-RC circuit increases according to the Equation 2 from the initial value greater than zero.

When the output voltage $V_{R-RC}$ reaches the reference level $V_{REF}$, the output of the comparator 110 changes, and accordingly, the phases of the first transition clock signal Φ1 and the second transition clock signal Φ2 generated by the clock generator 120 may be inverted. As a result, the first transistor M1 and the fourth transistor M4 are turned off, and the second transistor M2 and the third transistor M3 are turned on. During this course, the charges stored in the first capacitor C1 are discharged through the second transistor M2. At this time, the electric potential of the first terminal of the second capacitor C2 rapidly decreases to zero due to the second capacitor C2 that is discharged and the third transistor M3 that is turned-on, and the output voltage $V_{R-RC}$ may rapidly fall to the initial value. Afterwards, the current supplied through the first resistor R1 and the second resistor R2 charges the second capacitor C2, and the voltage $V_{C2}$ across the second capacitor C2 rises. At this time, as shown in FIG. 7, the output voltage $V_{R-RC}$ increases according to the Equation 2 from the initial value greater than zero.

When the output voltage $V_{R-RC}$ reaches the reference level $V_{REF}$, the output of the comparator 110 changes, and accordingly, the phases of the first transition clock signal Φ1 and the second transition clock signal Φ2 generated by the clock generator 120 may be inverted again. As a result, the first transistor M1 and the fourth transistor M4 are turned on, and the second transistor M2 and the third transistor M3 are turned off. During this course, the charges stored in the second capacitor C2 are discharged through the fourth transistor M4. At this time, the electric potential of the first terminal of the second capacitor C1 rapidly decreases to zero due to the first capacitor C1 that is discharged and the first transistor M1 that is turned-on, and the output voltage $V_{R-RC}$ may rapidly fall to the initial value. Afterwards, the current supplied through the first resistor R1 and the second resistor R2 charges the first capacitor C1, and the voltage $V_{C1}$ across the first capacitor C1 rises. At this time, as shown in FIG. 7, the output voltage $V_{R-RC}$ increases according to the Equation 2 from the initial value greater than zero.

Since the two capacitors C1 and C2 arranged in parallel are alternately used as described above, the oscillator circuit of FIG. 6 may solve the problem related to the size of the discharging switch in the conventional RC oscillator circuit, i.e., the problem that a large transistor is accompanied by a large amount of the leakage current while a small transistor causes a long discharging time. In other words, the oscillator circuit according to an exemplary embodiment may generate the oscillation signal with a uniform period or frequency under all operating conditions even if the sizes of the transistor switches M1-M4 are small.

In the meantime, since the two capacitors are alternately used, the discharging and reset of one capacitor is done through a parallel transistor switch while the other capacitor is being charged. For example, the second capacitor C2 is discharged through the transistor M4 while the first capacitor C1 is being charged, and is readily available in a next phase. Similarly, the first capacitor C1 naturally discharged through the transistor M2 while the second capacitor C2 is being charged, and is readily available in a next phase. Generally, a period of an output signal in the conventional RC oscillator circuit shown in FIG. 1 includes a comparator delay and a switch reset delay in addition to a RC transition time according to the RC time constant. According to the oscillator circuit of FIG. 6, however, since the capacitor is discharged and reset during the RC transition time of the other capacitor, the reset delay is negligible compared with the RC transition time and may be excluded from the oscillation period.

Figure 8:
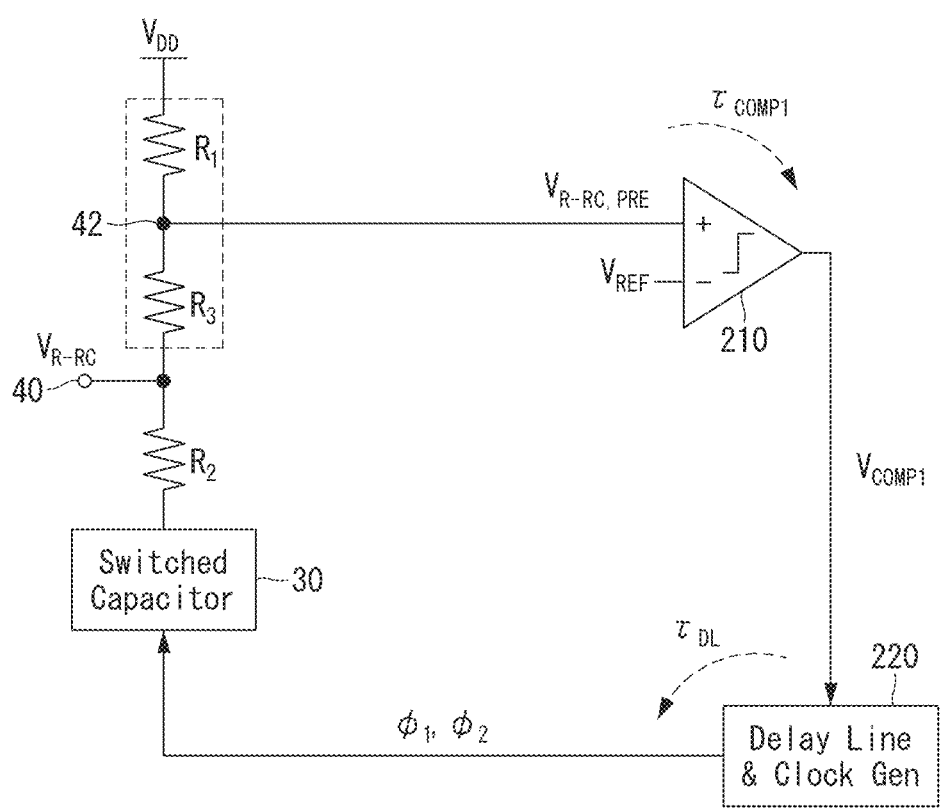
FIG. 8 is a block diagram of an oscillator circuit according to another exemplary embodiment of the present disclosure.
Figure 9:
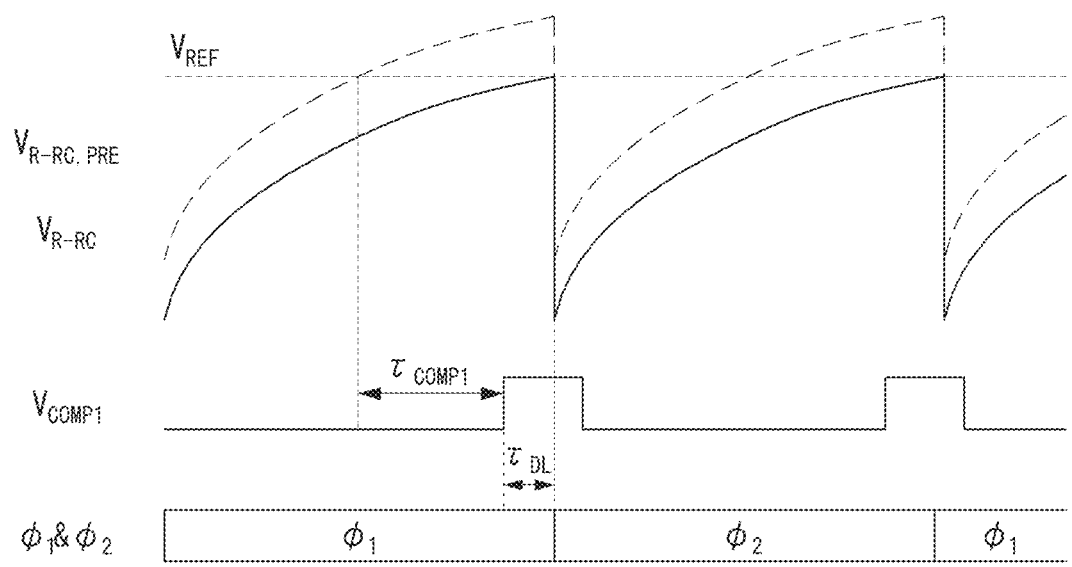
FIG. 9 is a waveform diagram showing waveforms of signals in the oscillator circuit of FIG. 8.

FIG. 8 is a block diagram of an oscillator circuit according to another exemplary embodiment of the present disclosure, and FIG. 9 is a waveform diagram showing waveforms of signals in the oscillator circuit of FIG. 8. The oscillator circuit according to the present embodiment includes a first through a third resistors R1-R3, a switched capacitor circuit 30, a comparator 210, and a signal delay and clock generator circuit 220. In the oscillator circuit, an additional delay may be introduced as needed in addition to the delay caused by the comparison operation in the comparator 210.

The first resistor R1, the third resistor R3, and the second resistor R2 are connected in series between the supply voltage VDD and the switched capacitor circuit 30. Hereinafter, a node between the third resistor R2 and the second resistor R2 will be referred to as an output node 40, and the voltage level at the output node 40 will be indicated by the output voltage $V_{R-RC}$. In addition, a node between the first resistor R1 and the third resistor R3 will be referred to as an auxiliary output node 42, and the voltage level at the auxiliary output node 42 will be indicated by an auxiliary output voltage $V_{R-RC,PRE}$. Accordingly, the first resistor R1 is disposed between the supply voltage VDD and the auxiliary output node 42, and the third resistor R3 is disposed between the auxiliary output node 42 and the output node 40. Further, the second resistor R2 is disposed between the output node 40 and the switched capacitor circuit 30. Compared with the R-RC circuits shown in FIGS. 4 and 6, the first resistor R1 is divided into the first resistor R1 and the third resistor R3, and the voltage level $V_{R-RC,PRE}$ at the auxiliary output node 42 between the first resistor R1 and the third resistor R3 is utilized as the auxiliary output voltage. The configuration and operation of the switched capacitor circuit 30 may be the same as that shown in the circuit of FIG. 6.

The comparator 210 may compare the auxiliary output voltage $V_{R-RC,PRE}$ with the reference voltage level $V_{REF}$. The auxiliary output voltage $V_{R-RC,PRE}$ at the auxiliary output node 42 is always higher than the output voltage $V_{R-RC}$ at the output node 40 by a voltage drop across the third resistor R3 and reaches the reference voltage level $V_{REF}$ faster than the output voltage $V_{R-RC}$. The comparator 210 may compare the auxiliary output voltage $V_{R-RC,PRE}$, instead of the output voltage $V_{R-RC}$, with the reference voltage level $V_{REF}$ so as to early detect that the output voltage $V_{R-RC}$ reaches the reference voltage level $V_{REF}$. Accordingly, the comparator delay may be contained in the RC transition time and may be negligible compared with the RC transition time. Therefore, the comparator delay may be excluded from the oscillation period.

The signal delay and clock generation circuit 220 includes a signal delay line and a clock generation circuit. The signal delay line may add an additional delay $\tau_{DL}$ to the comparator output $V_{COMP1}$, which is referred to as a 'base clock signal' hereinbelow, to generate a delayed base clock signal $V_{COMP1,D}$. The additional delay $\tau_{DL}$ added by the signal delay line may allow to precisely adjust the time required for the output voltage $V_{R-RC}$ to reach the reference voltage level $V_{REF}$. Meanwhile, when the comparator delay $\tau_{COMP1}$ in the base clock signal $V_{COMP1}$ varies, the additional delay $\tau_{DL}$ caused by the signal delay and clock generation circuit 220 is adjusted accordingly to keep the total delay constant and maintain the frequency stably. On the other hand, the clock generation circuit in the signal delay and clock generation circuit 220 may generate the first transition clock signal 1 and the second transition clock signal Φ2 based on the delayed base clock signal $V_{COMP1,D}$ to supply to the switched capacitor circuit 30.

Figure 10:
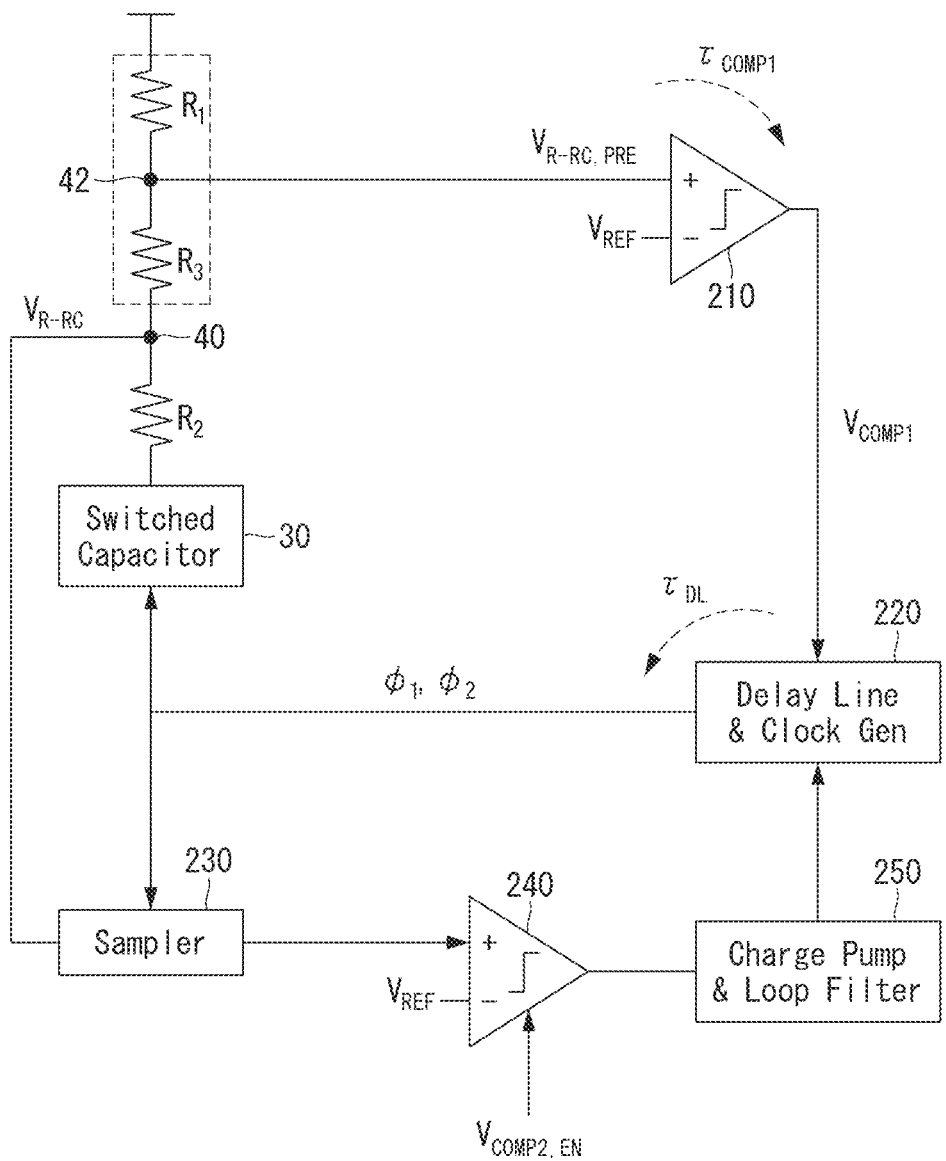
FIG. 10 is a block diagram of an oscillator circuit according to another exemplary embodiment of the present disclosure.
Figure 11:
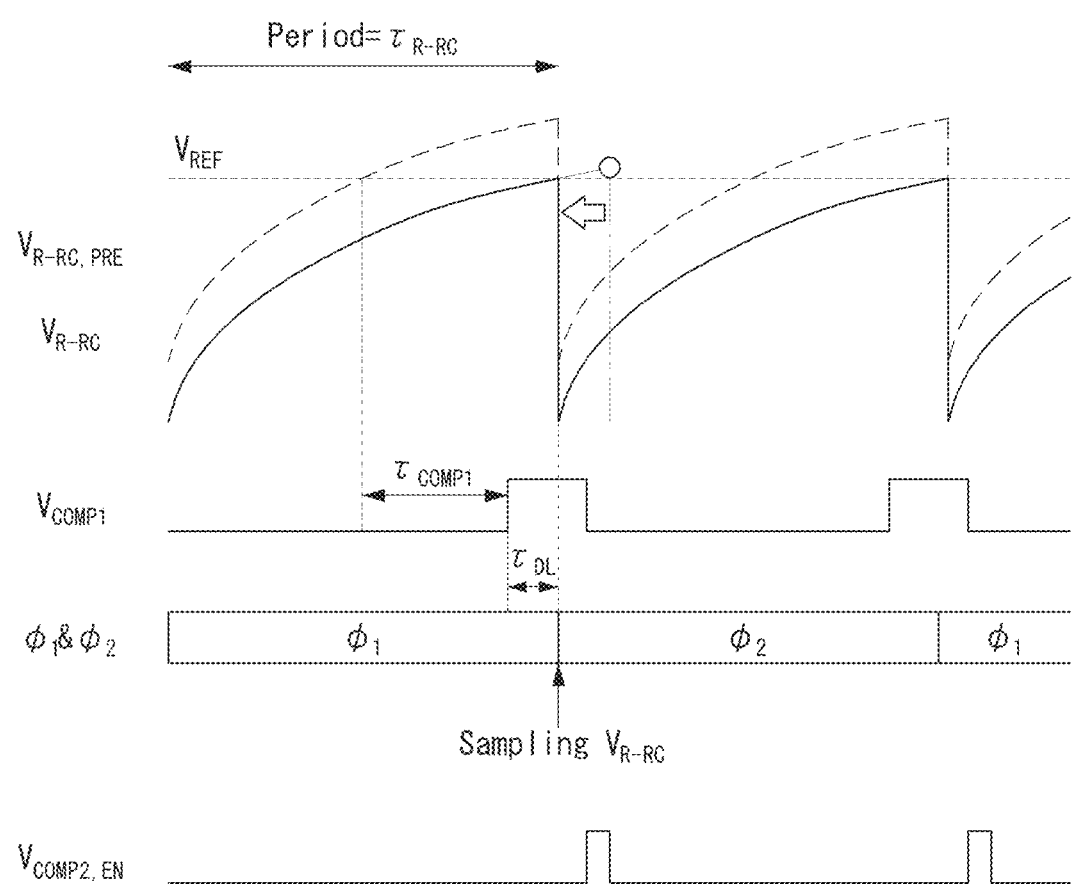
FIG. 11 is a waveform diagram showing waveforms of signals in the oscillator circuit of FIG. 10.

FIG. 10 is a block diagram of an oscillator circuit according to another exemplary embodiment of the present disclosure, and FIG. 11 is a waveform diagram showing waveforms of signals in the oscillator circuit of FIG. 10. The oscillator circuit according to the present embodiment includes a first through a third resistors R1-R3, a switched capacitor circuit 30, a first comparator 210, a signal delay and clock generator circuit 220, a sampler 230, a second comparator 240, and a charge pump and loop filter circuit 250.

The first resistor R1, the third resistor R3, the second resistor R2, the switched capacitor circuit 30, the first comparator 210, and the signal delay and clock generator circuit 220 may be configured identically or similarly to corresponding members in the embodiment shown in FIG. 8, and duplicate descriptions thereof are omitted for simplicity.

The first comparator 210 may compare the auxiliary output voltage $V_{R-RC,PRE}$ with the reference voltage $V_{REF}$. The auxiliary output voltage $V_{R-RC,PRE}$ at the auxiliary output node 42 is always higher than the output voltage $V_{R-RC}$ at the output node 40 by the voltage drop across the third resistor R3 and reaches the reference voltage level $V_{REF}$ faster than the output voltage $V_{R-RC}$. The first comparator 210 may compare the auxiliary output voltage $V_{R-RC,PRE}$, instead of the output voltage $V_{R-RC}$, with the reference voltage level $V_{REF}$ so as to early detect that the output voltage $V_{R-RC}$) reaches the reference voltage level $V_{REF}$.

The signal delay and clock generation circuit 220 includes a signal delay line and a clock generation circuit. The signal delay line may add an additional delay $\tau_{DL}$ to the comparator output $V_{COMP1}$, i.e., the base clock signal, to generate the delayed base clock signal $V_{COMP1,D}$. The additional delay $\tau_{DL}$ added by the signal delay line may allow to precisely adjust the time required for the output voltage $V_{R-RC}$ to reach the reference voltage level $V_{REF}$. The additional delay $\tau_{DL}$ added by the signal delay line may be adjusted according to an output voltage of a loop filter to precisely control the time required for the output voltage $V_{R-RC}$ to reach the reference voltage level $V_{REF}$. For example, when the comparator delay $\tau_{COMP1}$ in the base clock signal $V_{COMP1}$ varies, the additional delay $\tau_{DL}$ caused by the signal delay line is adjusted accordingly to keep the total delay constant and maintain the frequency stably.

The clock generation circuit in the signal delay and clock generation circuit 220 may generate the first transition clock signal Φ1 and the second transition clock signal Φ2 based on the delayed base clock signal $V_{COMPLD}$ to supply to the switched capacitor circuit 30 and the sampler 230. In addition, the clock generation circuit may generate an enable clock signal $V_{COMP2,EN}$ for enabling the second comparator 240.

The signal delay and clock generation circuit 220, the sampler 230, the second comparator 240, and the charge pump and loop filter circuit 250 constitute a bang-bang delay locked loop (DLL). The DLL provides a negative feedback path for adjusting the additional delay $\tau_{DL}$ introduced to the delayed base clock signal $V_{COMP1,D}$ from the base clock signal $V_{COMP1}$ by the signal delay line in the signal delay and clock generator circuit 220. In the feedback loop, the sampler 230 samples the output voltage $V_{R-RC}$. The second comparator 240 compares a sampled output voltage with the reference voltage level $V_{REF}$ according to the enable clock signal $V_{COMP2,EN}$. The charge pump and loop filter circuit 250 includes a charge pump and a loop filter. The charge pump adjusts a control voltage applied to the loop filter according to a comparison result of the second comparator 240. The loop filter performs a lowpass filtering of the control voltage from the charge pump. Accordingly, the signal delay and clock generator circuit 220 may adjust the additional delay $\tau_{DL}$ introduced to the delayed base clock signal $V_{COMP1,D}$ from the base clock signal $V_{COMP1}$ according to a control voltage from the charge pump and loop filter circuit 250. When the delay $\tau_{COMP1}$ of the comparator output $V_{COMP1}$ varies, the DLL may enable to stably maintain the frequency by adjusting the additional delay $\tau_{DL}$ caused by the signal delay line accordingly to keep the total delay constant.

Adjustment of the delay $\tau_{DL}$ can be done as follows. Referring to FIG. 11, when the delay $\tau_{COMP1}$ in the comparator output $V_{COMP1}$ is getting larger, the second comparator 240 may detect an increase in the delay $\tau_{COMP1}$ by comparing the sampled output voltage $V_{R-RC}$ with the reference voltage $V_{REF}$ and provides the charge pump with an output signal controlling the charge pump in a direction of the additional delay $\tau_{DL}$ to compensate the increase in the delay $\tau_{COMP1}$. Accordingly, the signal delay and clock generation circuit 220 controlled by the charge pump and loop filter circuit 250 may decrease the delay $\tau_{DL}$. Contrarily, when the delay $\tau_{COMP1}$ in the comparator output $V_{COMP1}$ is getting smaller, the second comparator 240 may detect a decrease in the delay $\tau_{COMP1}$ by comparing the sampled output voltage $V_{R-RC}$ with the reference voltage $V_{REF}$ and provides the charge pump with the output signal controlling the charge pump in a direction of increasing the additional delay $\tau_{DL}$ to compensate the decrease in the delay $\tau_{COMP1}$. Accordingly, the signal delay and clock generation circuit 220 controlled by the charge pump and loop filter circuit 250 may increase the delay $\tau_{DL}$. As a result, a sum of the delay $\tau_{COMP1}$ and the additional delay $\tau_{DL}$ may be kept constant, the time for the output voltage $V_{R-RC}$ to reach the reference voltage $V_{REF}$ may be maintained to be the same accurately, and the frequency of the oscillation signal of may be maintained stably.

As mentioned above, in the conventional oscillator circuit of FIG. 1 employing just a single comparator, when a rated power of the comparator is small, the comparison operation takes a long time and the delay caused by the comparison operation increases, which affect the period of the oscillation signal. Increasing the rated power of the comparator to reduce the delay increases the power consumption and hinders a low-power operation. The oscillator circuit according to the present embodiment, however, adjusts the additional delay $\tau_{DL}$ adaptively to the delay $\tau_{COMP1}$ in the comparator output $V_{COMP1}$ through the use of the feedback loop and precisely maintains the time for the output voltage $V_{R-RC}$ to reach the reference voltage $V_{REF}$.

Figure 12:
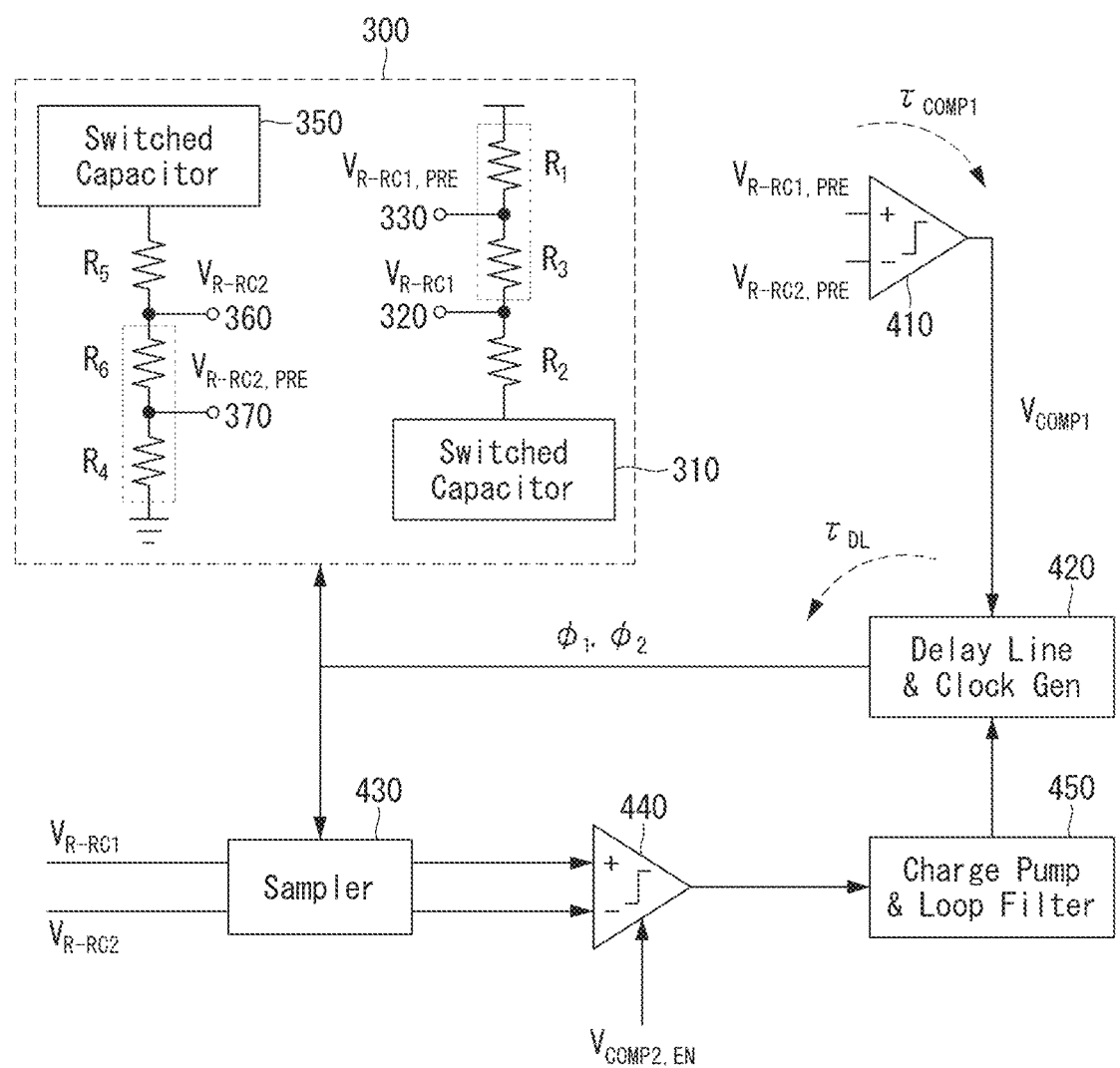
FIG. 12 is a block diagram of an oscillator circuit according to another exemplary embodiment of the present disclosure.
Figure 13:
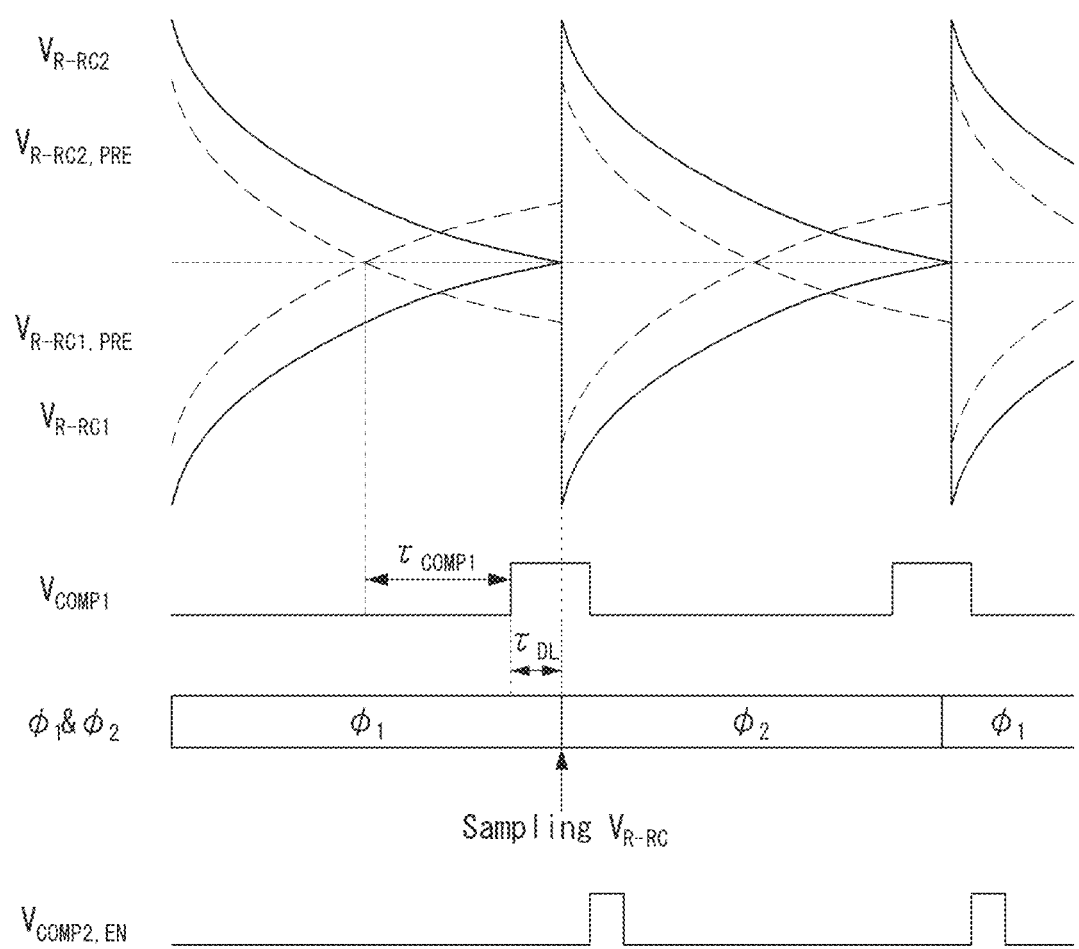
FIG. 13 is a waveform diagram showing waveforms of signals in the oscillator circuit of FIG. 12.

Although the embodiments implemented in single-ended circuits have been described above for simplicity, the oscillator circuit of the present disclosure may be implemented in a differential circuit so as to be less affected by a noise and operate more precisely. FIG. 12 shows another exemplary embodiment of the oscillator circuit implemented in the differential circuit, and FIG. 13 is a waveform diagram showing waveforms of signals in the oscillator circuit of FIG. 12. The oscillator circuit according to this embodiment includes an R-RC circuit 300, a first comparator 410, a signal delay and clock generator circuit 420, a sampler 430, a second comparator 440, and a charge pump and loop filter circuit 450.

The R-RC circuit 300 includes a first resistor R1, a third resistor R3, a second resistor R2, and a first switched capacitor circuit 310 sequentially connected in series between a first supply voltage and a second supply voltage. A node between the third resistor R3 and the second resistor R2 is referred to as a first output node 320, and the voltage level at the first output node 320 is indicated by a first output voltage $V_{R-RC1}$. A node between the first resistor R1 and the third resistor R3 is referred to as a first auxiliary output node 330, and the voltage level at the first auxiliary output node 330 is indicated by a first auxiliary output voltage $V_{R-RC1,PRE}$. Accordingly, the first resistor R1 is disposed between the first supply voltage and the first auxiliary output node 330, the third resistor R3 is disposed between the first auxiliary output node 330 and the first output node 320, and the second resistor R2 is disposed between the first output node 320 and the first switched capacitor circuit 310.

In addition, the R-RC circuit 300 includes a second switched capacitor circuit 350, a fifth resistor R5, a sixth resistor R6, and a fourth resistor R4 sequentially connected in series between a third supply voltage and a fourth supply voltage. A node between the fifth resistor R5 and the sixth resistor R6 is referred to as a second output node 360, and the voltage level at the second output node 360 is indicated by a second output voltage $V_{R-RC2}$. A node between the resistor R6 and the fourth resistor R4 is referred to as a second auxiliary output node 370, and the voltage level at the second auxiliary output node 370 is indicated by a second auxiliary output voltage $V_{R-RC2,PRE}$. Accordingly, the fifth resistor R5 is disposed between the second switched capacitor circuit 350 and the second output node 360, the sixth resistor R6 is disposed between the second output node 360 and the second auxiliary output node 370, and the fourth resistor R4 is disposed between the second auxiliary output node 370 and the fourth supply voltage.

The first comparator 410 compares the first auxiliary output voltage $V_{R-RC1,PRE}$ with the second auxiliary output voltage $V_{R-RC2,PRE}$. As shown in FIG. 13, the first auxiliary output voltage $V_{R-RC1,PRE}$ at the first auxiliary output node 330 is always higher than the first output voltage $V_{R-RC1}$ at the first output node 320 by a voltage drop across the third resistor R3. Similarly, the second auxiliary output voltage $V_{R-RC2,PRE}$ at the second auxiliary output node 370 is always lower than the second output voltage $V_{R-RC2}$ at the second output node 360 by a voltage drop across the sixth resistor R6. Therefore, the crossing point of the first and second auxiliary output voltages $V_{R-RC1,PRE}$ and $V_{R-RC2,PRE}$ is always earlier than the crossing of the first and second output voltages $V_{R-RC1}$ and $V_{R-RC2}$. The first comparator 410 compares the first and second auxiliary output voltages $V_{R-RC1,PRE}$ and $V_{R-RC2,PRE}$ with each other instead of comparing the first and second output voltages $V_{R-RC1}$ and $V_{R-RC2}$ with each other. The output signal $V_{COMP1}$ of the first comparator 410 is triggered earlier than the crossing point of the first and second output voltages $V_{R-RC1}$ and $V_{R-RC2}$, enables to early detect that the crossing point of the first and second output voltages $V_{R-RC1}$ and $V_{R-RC2}$.

The signal delay and clock generation circuit 420 includes a signal delay line and a clock generation circuit. The signal delay line may add an additional delay $\tau_{DL}$ to the base clock signal $V_{COMP1}$ output by first comparator 410 to generate the delayed base clock signal $V_{COMP1,D}$. The additional delay $\tau_{DL}$ added by the signal delay line may allow to precisely adjust the time to the crossing point of the first and second output voltages $V_{R-RC1}$ and $V_{R-RC2}$. The additional delay $\tau_{DL}$ introduced by the signal delay line may be adjusted according to an output voltage of a loop filter to precisely control a cross point timing of the first and second output voltages $V_{R-RC1}$ and $V_{R-RC2}$.

The clock generation circuit in the signal delay and clock generation circuit 420 may generate the first transition clock signal Φ1 and the second transition clock signal Φ2 based on the delayed base clock signal $V_{COMP1,D}$ to supply to the switched capacitor circuit 300 and the sampler 430. In addition, the clock generation circuit may generate an enable clock signal $V_{COMP2,EN}$ for enabling the second comparator 440.

The signal delay and clock generation circuit 420, the sampler 430, the second comparator 440, and the charge pump and loop filter circuit 450 constitute a bang-bang delay locked loop (DLL). The DLL provides a negative feedback path for adjusting the additional delay $\tau_{DL}$ introduced to the delayed base clock signal $V_{COMP1,D}$ from the base clock signal $V_{COMP1}$ by the signal delay line in the signal delay and clock generator circuit 420. In the feedback loop, the sampler 430 samples the first output voltage $V_{R-RC1}$ and the second output voltage $V_{R-RC2}$. The second comparator 440 compares a sampled first output voltage $V_{R-RC1}$ and a sampled second output voltage $V_{R-RC2}$. The charge pump and loop filter circuit 450 may include a charge pump and a loop filter. The charge pump may adjust a control voltage applied to the loop filter according to a comparison result of the second comparator 440. The loop filter performs a lowpass filtering of the control voltage from the charge pump. Accordingly, the signal delay and clock generator circuit 420 may adjust the additional delay $\tau_{DL}$ introduced to the delayed base clock signal $V_{COMP1,D}$ from the base clock signal $V_{COMP1}$ according to a control voltage from the charge pump and loop filter circuit 450. When the delay $\tau_{COMP1}$ of the comparator output $V_{COMP1}$ varies, the DLL may stably maintain the frequency of the oscillator circuit by adjusting the additional delay $\tau_{DL}$ caused by the signal delay and clock generation circuit 220 accordingly to keep the total delay to be constant.

Adjustment of the delay $\tau_{DL}$ can be done as follows. Referring to FIG. 13, when the delay $\tau_{COMP1}$ in the comparator output $V_{COMP1}$ is getting larger, the second comparator 440 may detect an increase in the delay $\tau_{COMP1}$ by comparing the sampled first output voltage $V_{R-RC1}$ with the sampled second output voltage $V_{R-RC2}$ and provides the charge pump with an output signal controlling the charge pump in a direction of decreasing the additional delay $\tau_{DL}$ to compensate the increase in the delay $\tau_{COMP1}$. Accordingly, the signal delay and clock generation circuit 420 controlled by the charge pump and loop filter circuit 450 may decrease the delay $\tau_{DL}$. Contrarily, when the delay $\tau_{COMP1}$ in the comparator output $V_{COMP1}$ is getting smaller, the second comparator 440 may detect a decrease in the delay $\tau_{COMP1}$ by comparing the sampled first output voltage $V_{R-RC1}$ with the sampled second output voltage $V_{R-RC2}$ and provides the charge pump with the output signal controlling the charge pump in a direction of increasing the additional delay $\tau_{DL}$ to compensate the decrease in the delay $\tau_{COMP1}$. Accordingly, the signal delay and clock generation circuit 420 controlled by the charge pump and loop filter circuit 450 may increase the delay $\tau_{DL}$. As a result, a sum of the delay $\tau_{COMP1}$ and the additional delay $\tau_{DL}$ may be kept constant, the time to the crossing point of the first output voltage $V_{R-RC1}$ and the second output voltage $V_{R-RC2}$ may be maintained to be the same accurately, and the frequency of the oscillation signal of may be maintained stably. In a steady state, the delay is locked so that the first transition clock signal Φ1 and the second transition clock signal Φ2 make transitions when the first output voltage $V_{R-RC1}$ and the second output voltage $V_{R-RC2}$ are equal to each other.

As described above, the oscillator circuit according to an exemplary embodiment enables to exclude the reset delay and the comparator delay from an oscillation cycle while using a low-leakage transistor for the switched capacitor. The oscillator circuit may achieve a stable output frequency across a wide temperature range from −40° C. to 125° C., for example.

Figure 14:
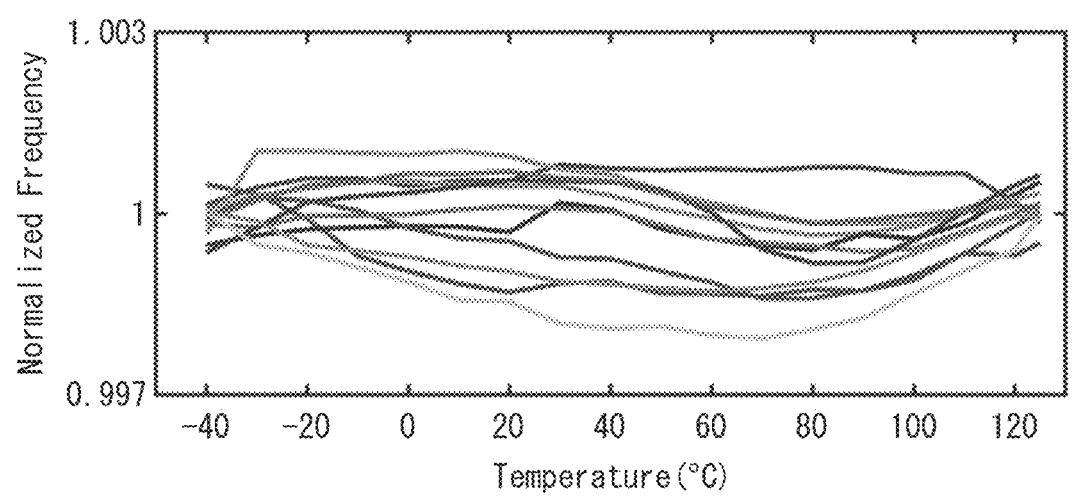
FIG. 14 illustrates frequency variations of fabricated sample oscillator circuit chips in a temperature range of −40° C. to 125° C.
Figure 16:
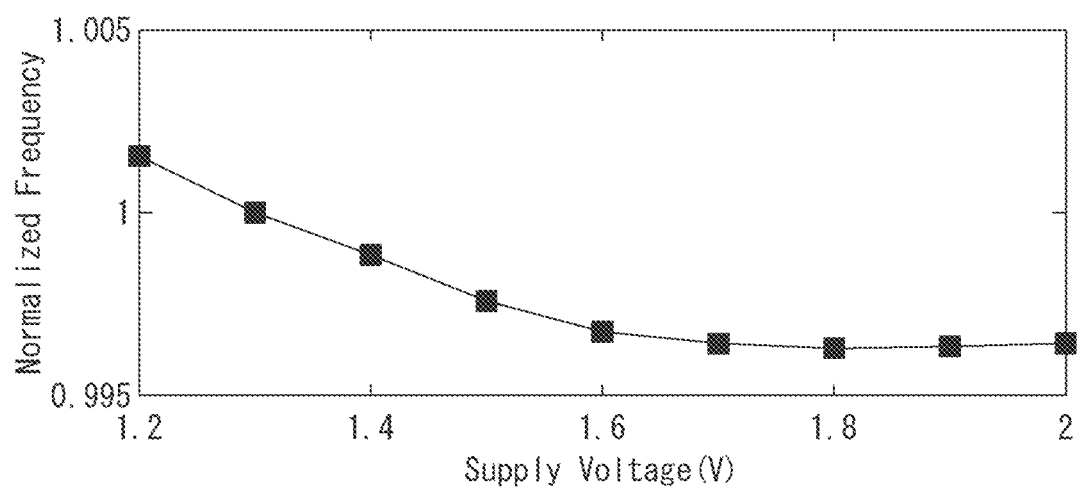
FIG. 16 is a graph showing normalized measurements of supply voltage dependencies of the frequency to verify the semiconductor integrated circuit chips implemented according to the embodiment of FIG. 12.

The R-RC oscillator circuit shown in FIG. 12 was fabricated in a 0.18 μm CMOS technology with an active area of 0.07 mm². In this implementation, capacitors of 1 pF were used for each of the first and second capacitors in the switched capacitor, and resistors of about 560 kΩ and 100 kΩ were used for a combination of the first and third resistors (i.e., R1+R3) and the second resistor R2, respectively. The combination of the first and third resistors (R1+R3) was composed of a p+-type polycrystalline (p+poly) resistor with or without silicide for the first-order temperature compensation, and the second resistor R2 was implemented with an n-well resistor. The oscillator circuit generated a 2.3 MHz frequency reference while consuming 7.6 μW at a supply voltage of 1.3V and a nominal temperature of 25° C. FIG. 14 depicts the frequency variation in the temperature range of −40° C. to 125° C. of the fabricated sample chips of the oscillator circuit. A total of 11 chips were measured, and two-point trimming was performed by adjusting only the first resistor R1 on a pull-down side. In FIG. 14, the lines are associated with measurement data of respective chips. An average temperature coefficient for the 11 chips was 7.93 ppm/° C. in the temperature range from −40° C. to 125° C. A line sensitivity was measured at 0.51%/V when the supply voltage was changed from 1.3V to 2.0V (As shown in FIG. 16).

Figure 15:
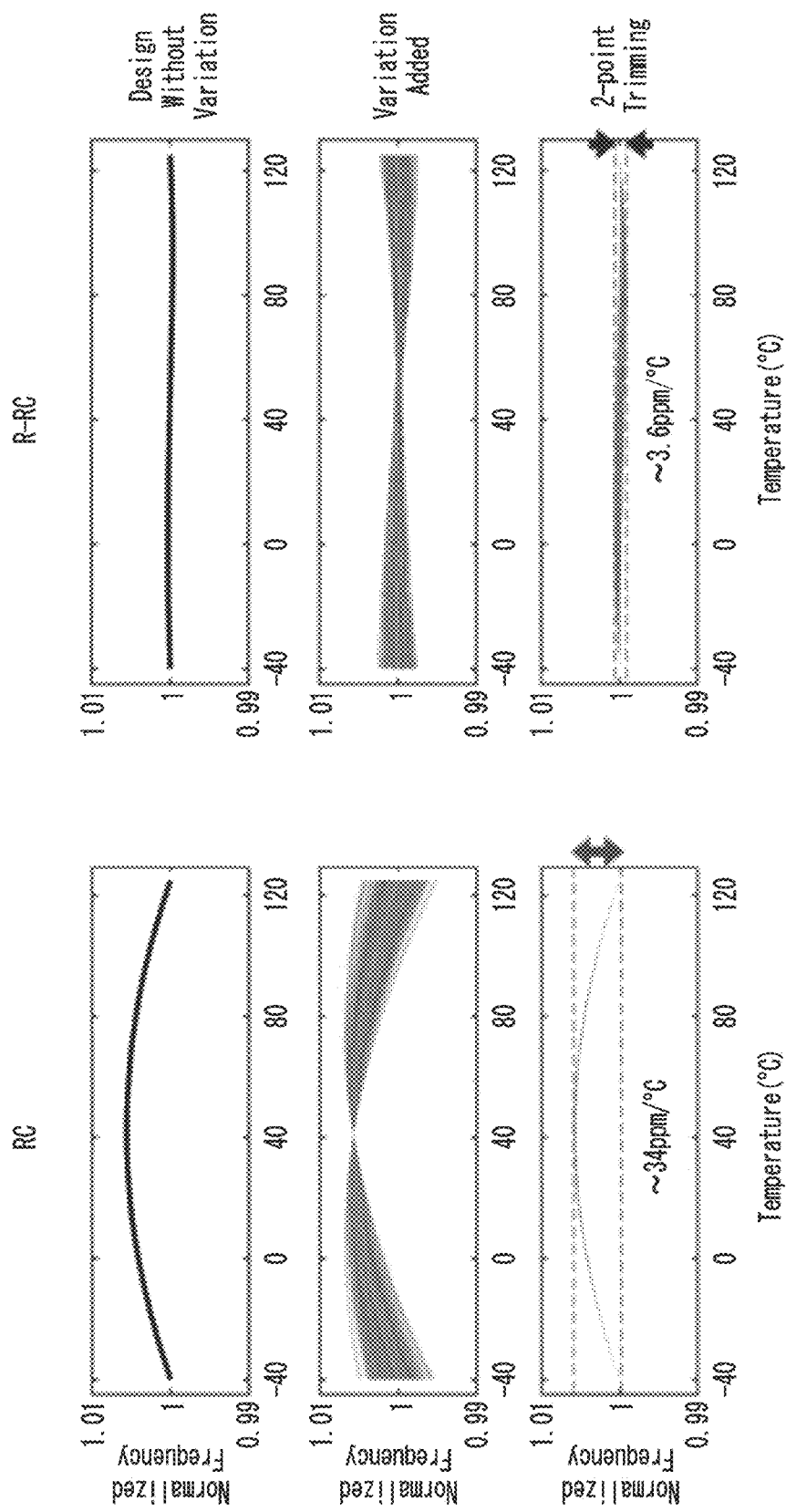
FIG. 15 show graphs illustrating normalized temperature dependencies of the frequency after two-point trimming compared with a conventional RC oscillator to verify semiconductor integrated circuit chips implemented according to the exemplary embodiment of FIG. 12.

FIG. 15 are graphs showing a temperature dependency of a normalized frequency after a two-point trimming compared with a conventional RC oscillator to verify the semiconductor integrated circuit chips implemented according to the embodiment shown in FIG. 4. In FIG. 15, graphs in a left side show the temperature dependencies of the conventional RC oscillator circuit and graphs in a right side show the temperature dependencies of the R-RC oscillator circuit according to an exemplary embodiment of the present disclosure.

In both cases, an ideal temperature dependency of the frequency may be represented by a single line as shown in an upper row in FIG. 15 since the resistances and the capacitances are assumed to be fixed. In particular, since the second-order temperature coefficient of the resistor is cancelled by the use of an additional resistor according to the present disclosure, the second-order dependency disappears and only a slight dependency of higher orders remain.

However, when the integrated circuit chip is actually manufactured, there may be some variations in the resistances and the capacitances between the chips. The graphs in a middle row in FIG. 15 show simulated temperature dependencies of the frequency generated by the oscillator circuit chips assuming that 1000 chips are tested while allowing normal deviations. Each line in the graphs represents a characteristic for each one of the 1000 chips. In both the conventional RC oscillator circuit and the R-RC oscillator circuit according to the present disclosure, the resistances at an extremely low and extremely high temperatures and the generated frequency may be different for each chip according to the variations.

The graphs in a lower row in FIG. 15 were obtained after performing the two-point trimming for each chip so that the frequency values at −40° C. and 125° C. were the same as each other. While the conventional RC oscillator circuit exhibited the temperature dependency of the frequency of about 34 ppm/1° C., the R-RC oscillator circuit according to the present disclosure exhibited the temperature dependency of the frequency of about 3.6 ppm/1° C. That is, the temperature dependency characteristics of the oscillator circuit according to the present disclosure improved by about 10 times compared with the conventional circuit.

FIG. 16 is a graph showing measurement values of supply voltage dependencies of normalized frequencies to verify the semiconductor integrated circuit chips implemented according to the embodiment shown in FIG. 12. When the supply voltage is changed in a range from 1.2 to 2 volts (V), there was little significant difference in the final frequency. That is, the oscillator circuit of the present disclosure reveals superior temperature independency characteristics as well as a good supply voltage independency characteristics.

It is to be mentioned here that all alternatives or aspects as discussed before and all aspects as defined by independent claims in the following claims can be used individually, i.e., without any other alternative or object than the contemplated alternative, object or independent claim. However, in other embodiments, two or more of the alternatives or the aspects or the independent claims can be combined with each other and, in other embodiments, all aspects, or alternatives and all independent claims can be combined to each other.

The description of the disclosure is merely exemplary in nature and, thus, variations that do not depart from the substance of the disclosure are intended to be within the scope of the disclosure. Such variations are not to be regarded as a departure from the spirit and scope of the disclosure. Thus, it will be understood by those of ordinary skill in the art that various changes in form and details may be made without departing from the spirit and scope as defined by the following claims.

What is claimed is:

1. An oscillator circuit device, comprising:
   a resistor circuit comprising a first resistor disposed between a first supply voltage level and an output node;
   a resistor-capacitor circuit comprising a second resistor and a switched capacitor circuit disposed between the output node and a second supply voltage level and connected in series, and a switch capable of discharging electric charges accumulated in the switched capacitor circuit; and
   a comparator configured to compare a voltage level to be compared obtained from the resistor circuit with a predetermined reference to allow the switch to be opened and closed according to a comparison result,
   wherein the switched capacitor circuit is disposed between the second resistor and the second supply voltage level and comprises two capacitors connected in parallel to each other to be alternately charged and discharged.

2. The oscillator circuit device of claim 1, wherein the resistor circuit comprises a single resistor,
   wherein the output node is a node between the resistor circuit and the resistor-capacitor circuit.

3. The oscillator circuit device of claim 2, wherein the voltage level to be compared is a voltage level of the output node.

4. The oscillator circuit device of claim 1, wherein the resistor circuit comprises:
   the first resistor; and
   a third resistor disposed between the first resistor and the output node and connected in series to the first resistor.

5. The oscillator circuit device of claim 4, wherein the voltage level to be compared is an auxiliary output voltage, which corresponds to a voltage level of an auxiliary output node between the first resistor and the third resistor.

6. The oscillator circuit device of claim 5, wherein the switched capacitor circuit comprises:
   a first capacitor of the two capacitors having a first terminal connected to the second resistor;
   a first transistor having a drain connected to a second terminal of the first capacitor, a source connected to ground, and a gate suitable for receiving a first transition clock signal;
   a second transistor having a drain connected to the first terminal of the first capacitor, a source connected to the second terminal of the first capacitor, and a gate suitable for receiving a second transition clock signal;
   a second capacitor of the two capacitors having a first terminal connected to the second resistor;
   a third transistor having a drain connected to a second terminal of the second capacitor, a source connected to ground, and a gate suitable for receiving the second transition clock signal; and
   a fourth transistor having a drain connected to the first terminal of the second capacitor, a source connected to a fourth terminal of the second capacitor, and a gate suitable for receiving the first transition clock signal.

7. The oscillator circuit device of claim 6, further comprising:
   a clock generation circuit configured to generate the first transition clock signal and the second transition clock signal according to an output signal of the comparator.

8. The oscillator circuit device of claim 7, wherein the clock generation circuit comprises a signal delay line configured to delay the output signal of the comparator.

9. The oscillator circuit device of claim 8, further comprising:
   a feedback loop circuit configured to adjust a delay introduced to the output signal of the comparator by the clock generation circuit.

10. The oscillator circuit device of claim 9, wherein the comparator comprises a first comparator configured to compare the auxiliary output voltage with the predetermined reference,
    wherein the feedback loop circuit comprises:
    a second comparator configured to compare an output voltage of the output node with the predetermined reference;
    a charge pump configured to adjust a control voltage according to an output of the second comparator; and
    a loop filter configured to filter the control voltage to provide a filtered control voltage to the clock generation circuit, so that the clock generation circuit adjusts the delay introduced to the output signal of the first comparator according to the filtered control voltage.

11. The oscillator circuit device of claim 10, wherein the feedback loop circuit further comprises:
a sampler configured to sample the output voltage to provide a sampled output voltage to the second comparator.

12. An oscillator circuit device, comprising:
a first resistor disposed between a first supply voltage level and a first auxiliary output node;
a second resistor and a first switched capacitor circuit connected in series and disposed between a first output node and a second supply voltage level;
a third resistor disposed between the first auxiliary output node and the first output node;
a fourth resistor disposed between a second auxiliary output node and a fourth supply voltage level;
a fifth resistor and a second switched capacitor circuit connected in series and disposed between a third supply voltage level and a second output node;
a sixth resistor disposed between the second output node and the second auxiliary output node;
a first comparator configured to compare a first auxiliary output voltage level at the first auxiliary output node with a second auxiliary output voltage level of at the second auxiliary output node; and
a signal delay and clock generation circuit configured to generate transition clock signals for controlling charging and discharging operations of the first switched capacitor circuit and the second switched capacitor circuit according to an output of the first comparator.

13. The oscillator circuit device of claim 12, wherein the signal delay and clock generation circuit comprises a signal delay line configured to add an additional delay to the output of the first comparator.

14. The oscillator circuit device of claim 13, further comprising:
a feedback loop circuit configured to adjust the additional delay added to the output of the first comparator by the signal delay and clock generation circuit.

15. The oscillator circuit device of claim 14, wherein the feedback loop circuit comprises:
a second comparator configured to compare a first output voltage level of the first output node with a second output voltage level of the second output node;
a charge pump configured to adjust a control voltage according to an output of the second comparator; and
a loop filter configured to filter the control voltage to provide a filtered control voltage to the signal delay and clock generation circuit, so that the signal delay and clock generation circuit adjusts the additional delay added to the output of the first comparator according to the filtered control voltage.

16. The oscillator circuit device of claim 15, wherein the feedback loop circuit further comprises:
a sampler configured to sample the first output voltage level and the second output voltage level to provide sampled output voltage levels to the second comparator.

* * * * *